United States Patent
Muramatsu

(10) Patent No.: US 8,953,147 B2
(45) Date of Patent: *Feb. 10, 2015

(54) SPATIAL LIGHT MODULATION UNIT, ILLUMINATION OPTICAL APPARATUS, EXPOSURE APPARATUS, AND DEVICE MANUFACTURING METHOD

(75) Inventor: Kouji Muramatsu, Nakakoma-gun (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/409,870

(22) Filed: Mar. 1, 2012

(65) Prior Publication Data

US 2012/0212799 A1    Aug. 23, 2012

Related U.S. Application Data

(63) Continuation of application No. 12/267,556, filed on Nov. 7, 2008, now Pat. No. 8,144,308.

(60) Provisional application No. 60/996,406, filed on Nov. 15, 2007.

(30) Foreign Application Priority Data

Nov. 8, 2007    (JP) .................................. 2007-290234

(51) Int. Cl.
*G03F 7/20*    (2006.01)

(52) U.S. Cl.
CPC ........ *G03F 7/70116* (2013.01); *G03F 7/70075* (2013.01)
USPC .............................................. 355/67; 355/77

(58) Field of Classification Search
CPC .................................................. G03F 7/70075
USPC ........................................................... 355/67
See application file for complete search history.

(56) References Cited

U.S. PATENT DOCUMENTS

| | | |
|---|---|---|
| 5,229,872 A | 7/1993 | Mumola |
| 5,312,513 A | 5/1994 | Florence et al. |

(Continued)

FOREIGN PATENT DOCUMENTS

| | | |
|---|---|---|
| EP | 0 779 530 | 6/1997 |
| EP | 1 826 616 A2 | 8/2007 |

(Continued)

OTHER PUBLICATIONS

Office Action issued Mar. 28, 2013, in Japanese Patent Application No. 2007-290234.

(Continued)

*Primary Examiner* — Peter B Kim
*Assistant Examiner* — Michelle Iacoletti
(74) *Attorney, Agent, or Firm* — Miles & Stockbridge P.C.

(57) ABSTRACT

An illumination optical apparatus capable of forming a pupil intensity distribution of desired shape and illuminance and, in turn, capable of realizing illumination conditions of great variety. The apparatus has a spatial light modulation unit composed of a first spatial light modulator and a second spatial light modulator arranged in an order of incidence of light, and a distribution forming optical system to form a predetermined light intensity distribution on an illumination pupil, based on a beam having traveled via the first spatial light modulator and the second spatial light modulator. The first spatial light modulator has a plurality of first optical elements which are two-dimensionally arranged and postures of which each are individually controlled. The second spatial light modulator has a plurality of second optical elements which are two-dimensionally arranged in correspondence to the first optical elements and postures of which each are individually controlled.

11 Claims, 8 Drawing Sheets

(56) References Cited

U.S. PATENT DOCUMENTS

| | | |
|---|---|---|
| 6,285,488 B1 * | 9/2001 | Sandstrom ................... 359/290 |
| 6,438,199 B1 * | 8/2002 | Schultz et al. ................... 378/34 |
| 6,737,662 B2 | 5/2004 | Mulder et al. |
| 6,885,493 B2 | 4/2005 | Ljungblad et al. |
| 6,891,655 B2 | 5/2005 | Grebinski et al. |
| 6,900,915 B2 | 5/2005 | Nanjyo et al. |
| 6,958,806 B2 | 10/2005 | Mulder et al. |
| 7,015,491 B2 | 3/2006 | Eurlings et al. |
| 7,095,546 B2 | 8/2006 | Mala et al. |
| 7,714,983 B2 | 5/2010 | Koehler et al. |
| 2003/0038225 A1 | 2/2003 | Mulder et al. |
| 2004/0108467 A1 | 6/2004 | Eurlings et al. |
| 2005/0095749 A1 | 5/2005 | Krellmann et al. |
| 2006/0068334 A1 | 3/2006 | Sandstrom et al. |
| 2006/0138349 A1 | 6/2006 | Bleeker et al. |
| 2006/0170901 A1 | 8/2006 | Tanitsu et al. |
| 2006/0175556 A1 | 8/2006 | Yabuki |
| 2006/0203214 A1 | 9/2006 | Shiraishi |
| 2007/0013888 A1 | 1/2007 | Flagello et al. |
| 2007/0146676 A1 | 6/2007 | Tanitsu et al. |
| 2007/0146853 A1 | 6/2007 | Singer et al. |
| 2007/0165202 A1 | 7/2007 | Koehler et al. |
| 2007/0216794 A1 | 9/2007 | Neidrich |
| 2007/0216889 A1 * | 9/2007 | Nishii ............................. 355/67 |
| 2007/0273853 A1 | 11/2007 | Bleeker et al. |
| 2007/0296936 A1 | 12/2007 | Kato et al. |
| 2008/0079930 A1 | 4/2008 | Klarenbeek |
| 2008/0239268 A1 | 10/2008 | Mulder et al. |
| 2008/0259304 A1 | 10/2008 | Dierichs |
| 2008/0278704 A1 * | 11/2008 | Endres et al. ................... 355/67 |
| 2009/0002671 A1 | 1/2009 | Tanaka |

FOREIGN PATENT DOCUMENTS

| | | |
|---|---|---|
| EP | 2 001 042 A2 | 12/2008 |
| JP | 6-124873 | 5/1994 |
| JP | 6-291023 | 10/1994 |
| JP | 8-313842 | 11/1996 |
| JP | 10-303114 | 11/1998 |
| JP | 11-003849 | 1/1999 |
| JP | 2002-353105 | 12/2002 |
| JP | 2003-022967 | 1/2003 |
| JP | 2004-304135 | 10/2004 |
| JP | 2006-054328 | 2/2006 |
| JP | 2006-113437 | 4/2006 |
| JP | 2007-150295 A | 6/2007 |
| JP | 2007-158271 A | 6/2007 |
| KR | 10-2002-0092207 A | 12/2002 |
| WO | WO 99/49504 | 9/1999 |
| WO | WO 2006/080285 | 8/2006 |
| WO | WO 2006/097135 | 9/2006 |
| WO | WO 2007/111146 A1 | 10/2007 |
| WO | WO 2008/061681 | 5/2008 |
| WO | WO 2008/131928 | 11/2008 |

OTHER PUBLICATIONS

Office Action issued Sep. 26, 2014, in Korean Patent Application No. 10-2010-7012541.

* cited by examiner

SPATIAL LIGHT MODULATION UNIT, ILLUMINATION OPTICAL APPARATUS, EXPOSURE APPARATUS, AND DEVICE MANUFACTURING METHOD

CROSS-REFERENCE TO RELATED APPLICATION

This application is a continuation of application Ser. No. 12/267,556 filed Nov. 7, 2008. Also, this application is based upon and claims the benefit of priority from Provisional Application No. 60/996,406 filed on Nov. 15, 2007, the entire contents of which are incorporated herein by reference.

BACKGROUND OF THE INVENTION

1. Field of the Invention

An embodiment of the present invention relates to a spatial light modulation unit, an illumination optical apparatus, an exposure apparatus, and a device manufacturing method. More particularly, the present invention relates to an illumination optical apparatus suitably applicable to an exposure apparatus for manufacturing such devices as semiconductor devices, imaging devices, liquid-crystal display devices, and thin-film magnetic heads by lithography.

2. Related Background Art

In a typical exposure apparatus of this type, a light beam emitted from a light source travels through a fly's eye lens as an optical integrator to form a secondary light source (a predetermined light intensity distribution on an illumination pupil in general) as a substantial surface illuminant consisting of a large number of light sources. In this specification the light intensity distribution on the illumination pupil will be referred to hereinafter as a "pupil intensity distribution." The illumination pupil is defined as a position such that an illumination target surface becomes a Fourier transform surface of the illumination pupil by action of an optical system between the illumination pupil and the illumination target surface (a mask or a wafer in the case of the exposure apparatus).

Beams from the secondary light source are condensed by a condenser lens to superposedly illuminate the mask on which a predetermined pattern is formed. Light passing through the mask travels through a projection optical system to be focused on the wafer, whereby the mask pattern is projected (or transferred) onto the wafer to effect exposure thereof. Since the pattern formed on the mask is a highly integrated one, an even illuminance distribution must be obtained on the wafer in order to accurately transfer this fine pattern onto the wafer.

There is a hitherto proposed illumination optical apparatus capable of continuously changing the pupil intensity distribution (and, in turn, an illumination condition) without use of a zoom optical system (see Japanese Patent Application Laid-open No. 2002-353105 (Document 1)). The illumination optical apparatus disclosed in Document 1 is configured using a movable multi-mirror composed of a large number of micro mirror elements which are arranged in an array form and an inclination angle and inclination direction of each of which are individually driven and controlled. An incident beam is deflected in a state in which the beam is divided in micro units by respective reflecting surfaces in the movable multi-mirror. The movable multi-mirror converts a cross section of the incident beam into a desired shape and size and, in turn, realizes a desired pupil intensity distribution.

SUMMARY OF THE INVENTION

The present inventors have examined the above prior art, and as a result, have discovered the following problems.

Namely, since the illumination optical apparatus described in Document 1 uses the movable multi-mirror singly as a spatial light modulator, it is unable to simultaneously control positions and angles of rays incident to the entrance plane of the fly's eye lens. As a consequence, when the pupil intensity distribution is attempted to be set in a desired shape, it becomes difficult to achieve constant illuminance; conversely, when the illuminance is attempted to be set at a constant level in the pupil intensity distribution, it becomes difficult to obtain the pupil intensity distribution in a desired shape.

The present invention has been accomplished in order to solve the problem as described above, and an object of the invention is to provide an illumination optical apparatus capable of forming a pupil intensity distribution of a desired shape and desired illuminance and therefore capable of realizing illumination conditions of great variety, a spatial light modulation unit applicable to the illumination optical apparatus, an exposure apparatus capable of performing good exposure under an appropriate illumination condition realized according to a pattern characteristic, using the illumination optical apparatus capable of realizing the illumination conditions of great variety, and a device manufacturing method using the exposure apparatus.

In order to solve the above-described problem, an embodiment of the present invention provides a spatial light modulation unit which is arranged in an optical path of an illumination optical apparatus and comprises a first spatial light modulator and a second spatial light modulator arranged in an order of incidence of light. The first spatial light modulator has a plurality of first optical elements which are two-dimensionally arranged and postures of which each are individually controlled. The second spatial light modulator has a plurality of second optical elements which are two-dimensionally arranged in correspondence to the plurality of first optical elements and postures of which each are individually controlled.

An embodiment of the present invention provides an illumination optical apparatus which illuminates an illumination target surface on the basis of light from a light source. The illumination optical apparatus comprises a spatial light modulation unit having the structure as described above (the spatial light modulation unit according to the present invention), and a distribution forming optical system to form a predetermined light intensity distribution on an illumination pupil of the illumination optical apparatus, based on a beam having traveled via the first spatial light modulator and the second spatial light modulator.

An embodiment of the present invention provides an exposure apparatus which comprises an illumination optical apparatus having the structure as described above (the illumination optical apparatus according to the present invention), and the exposure apparatus performing exposure of a predetermined pattern illuminated by the illumination optical apparatus, on a photosensitive substrate.

An embodiment of the present invention provides a device manufacturing method which comprises an exposure block, a development block, and a processing block. The exposure block is to effect exposure of a predetermined pattern on a photosensitive substrate, using an exposure apparatus having the structure as described above (the exposure apparatus according to the present invention). The development block is to develop the photosensitive substrate onto which the predetermined pattern has been transferred, and then form a mask layer in a shape corresponding to the predetermined pattern on a surface of the photosensitive substrate. The processing block is to process the surface of the photosensitive substrate through the mask layer.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DESCRIPTION OF THE PREFERRED EMBODIMENTS

Embodiments of the spatial light modulation unit, illumination optical apparatus, exposure apparatus, and device manufacturing method according to the present invention will be described below in detail with reference to FIGS. 1, 2A to 2D and 3 to 8. In the description of the drawings, the same portions and the same elements will be denoted by the same reference symbols, without redundant description.

Figure 1:
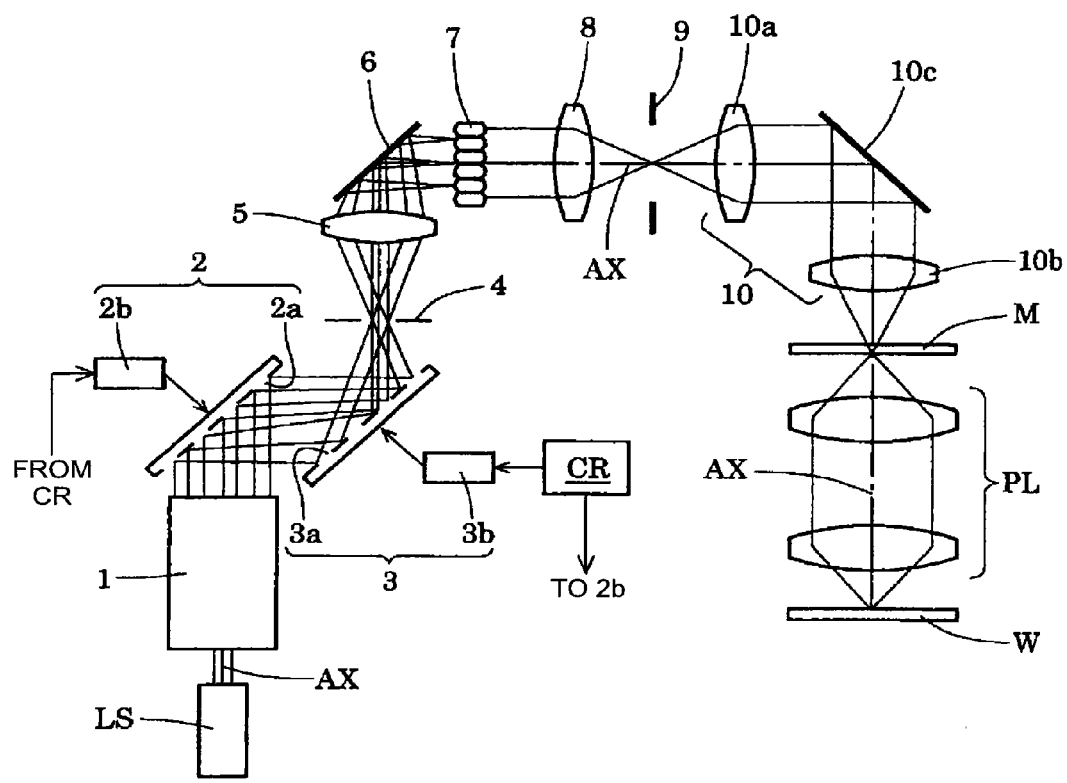
FIG. 1 is a drawing schematically showing a configuration of an exposure apparatus according to an embodiment of the present invention (incorporating the spatial light modulation unit and the illumination optical apparatus according to an embodiment of the present invention)
Figure 1:
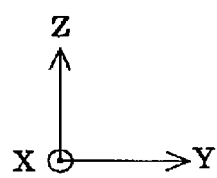

FIG. 1 is a drawing schematically showing a configuration of the exposure apparatus according to an embodiment of the present invention. In FIG. 1, the Z-axis is set along a direction of a normal to a wafer W being a photosensitive substrate, the Y-axis along a direction parallel to the plane of FIG. 1 in a plane of the wafer W, and the X-axis along a direction normal to the plane of FIG. 1 in the plane of the wafer W.

Referring to FIG. 1, a light source LS supplies exposure light (illumination light) to the exposure apparatus according to an embodiment of the present invention. The light source LS applicable herein is, for example, an ArF excimer laser light source which supplies light at the wavelength of 193 nm, or a KrF excimer laser light source which supplies light at the wavelength of 248 nm. A light beam emitted along the optical axis and in the Z-direction from the light source LS travels through a sending optical system 1 having a well-known configuration and is sequentially incident to a first spatial light modulator 2 and a second spatial light modulator 3.

The sending optical system 1 has functions to convert the incident beam into a beam with a cross section of an appropriate size and shape and guide the thus-shaped beam to the first spatial light modulator 2, and to actively correct positional variation and angular variation of the beam incident to the first spatial light modulator 2. The first spatial light modulator 2 has a plurality of mirror elements (optical elements in general) 2a arranged two-dimensionally, and a drive unit 2b which individually controls and drives postures of the mirror elements 2a in accordance with a posture control signal from a control unit CR.

The second spatial light modulator 3 also has a plurality of mirror elements 3a (optical elements in general) arranged two-dimensionally, and a drive unit 3b which individually controls and drives postures of the mirror elements 34a in accordance with a posture control signal from the control unit CR as the first spatial light modulator 2 does. The mirror elements 3a of the second spatial light modulator 3 are two-dimensionally arranged in one-to-one correspondence to the mirror elements 2a of the first spatial light modulation unit 2, and the postures thereof are individually controlled. The action of the spatial light modulation unit having the first spatial light modulator 2 and the second spatial light modulator 3 will be described hereinbelow.

Figure 2A:
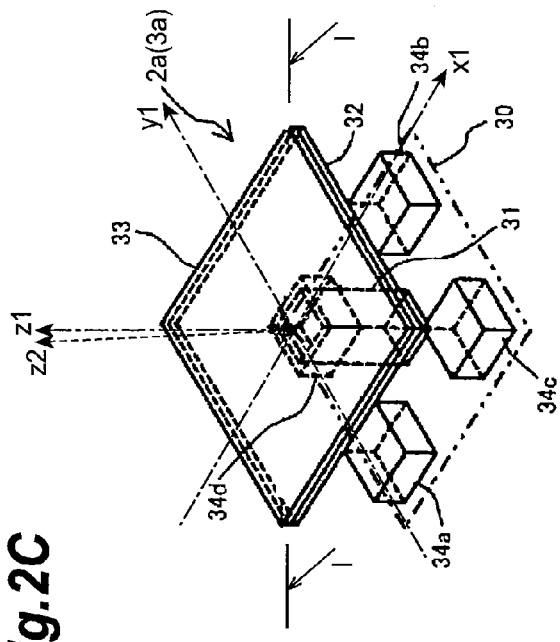
FIGS. 2A to 2D are drawings for schematically explaining a configuration of each of spatial light modulators in the exposure apparatus shown in FIG. 1.

The configuration of the spatial light modulation unit (first spatial light modulation unit) composed of the first and second spatial light modulators 2, 3 will be described below with reference to FIGS. 2A to 2D. FIG. 2A is a perspective view showing the two-dimensional arrangement of mirror elements 2a in the first spatial light modulator 2 (or mirror elements 3a in the second spatial light modulator 3), FIG. 2B a drawing for explaining parameters for control on the postures of the mirror elements 2a (3a), FIG. 2C a partial perspective view showing one of the mirror elements 2a (3a), and FIG. 2D a drawing showing a cross section along line I-I, of the mirror element 2a (3a) shown in FIG. 2C. It is noted that FIGS. 2A to 2D are depicted without hatching for sections, for easier viewing.

Each of the first and second spatial light modulators 2, 3, as shown in FIG. 2A, is a movable multi-mirror including the mirror elements 2a (3a) being a large number of micro reflecting elements laid with their reflecting surface of a planar shape up. Each mirror element 2a (3a) is movable and inclination of the reflecting surface (mirror surface) thereof, i.e., an angle and direction of inclination of the reflecting surface, is independently controlled by the control unit CR (posture control of the reflecting surfaces). Each mirror element 2a (3a) can be continuously or discretely rotated by a desired angle of rotation around each of axes of rotation along two directions parallel to the reflecting surface thereof and orthogonal to each other. Namely, each mirror element 2a (3a) is so configured that the inclination thereof can be controlled in two dimensions along the reflecting surface thereof. In the case of discrete rotation, a preferred control method is to control the angle of rotation in multiple stages (e.g., . . . , −2.5°, −2.0°, . . . , 0°, +0.5°, . . . , +2.5°, . . . ).

Figure 2C:
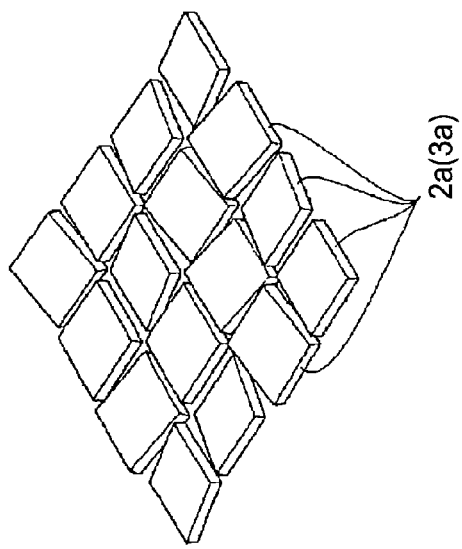
Figure 2B:
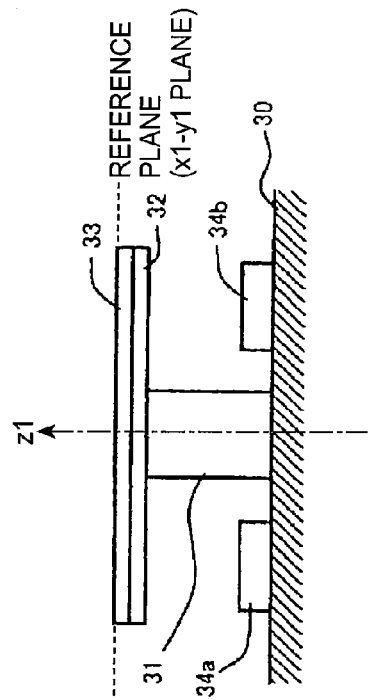

The above-described posture control of the reflecting surface for each mirror element 2a (3a) is implemented by adjusting an angle θ between a normal to a reference plane in each of the first and second spatial light modulators 2 (3) (z1-axis) and a normal to the reflecting surface (z2-axis), as shown in FIG. 2B. The reference plane herein is a plane coincident with the reflecting surface before the posture control, which is an x1-y1 plane defined by an x1-axis and a y1-axis orthogonal to the normal z2 to the reflecting surface before the posture control. The angle θ between the normal z1 (z1-axis) to the reference plane and the normal z2 to the reflecting surface is given by a rotation angle component $\theta_{x1}$ around the x1-axis and a rotation angle component $\theta_{y1}$ around the y1-axis, as specific posture control information. Specifically, the rotation angle component $\theta_{x1}$ is an angle between the normal z1 to the reference plane and the normal z2 to the reflecting surface when the normal z2 is projected onto the y1-z1 plane, and the rotation angle component $\theta_{x1}$ is an angle between the normal z1 to the reference plane and the normal z2 to the reflecting surface when the normal z2 is projected onto the x1-z1 plane.

In addition, the contour of the mirror elements 2a (3a) is square in this embodiment, but the contour is not limited to it. However, the contour is preferably a shape permitting arrangement without a gap (the closest packing) in terms of light utilization efficiency. The gap between adjacent mirror elements 2a (3a) is preferably set to a necessary minimum level.

Figure 2D:
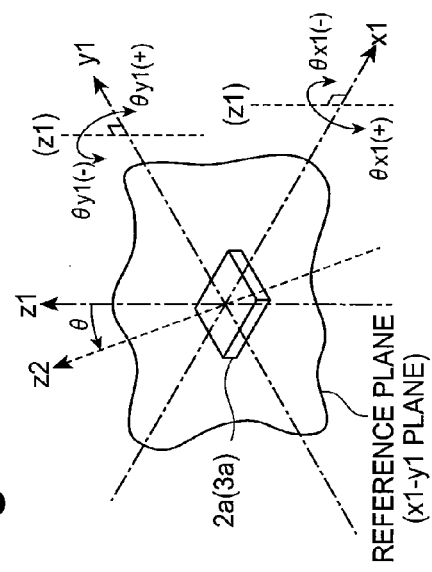

FIG. 2C is a drawing schematically showing a configuration of one mirror element out of the plurality of mirror elements 2a (3a) in the first and second spatial light modulators 2, 3 and, more specifically, a drawing schematically showing a drive unit for controlling the posture of the reflecting surface in the mirror element 2a (3a). FIG. 2D is a drawing showing a cross section of the mirror element 2a (3a) along line I-I shown in FIG. 2C. In FIGS. 2C and 2D, the mirror element 2a (3a) has a base 30, a support 31 disposed on this base 30, a plate member 32 connected to the support 31 on the opposite side to the base 30, a reflecting surface 33 consisting of a reflecting film formed on this plate member 32, and four electrodes 34a-34d arranged so as to surround the support 31 on the base 30.

The plate member 32 is inclinable around two axes (x1-axis and y1-axis) orthogonal to each other on a plane parallel to the base 30 with a fulcrum at a joint to the support 31. Then potentials are given to the electrodes 34a-34d arranged at respective positions on the base side corresponding to the four corners of the plate member 32, to generate an electrostatic force between each electrode 34a-34d and the plate member 32, thereby varying the gap between each electrode 34a-34d and the plate member 32 (drive unit). This causes the plate member 32 to be inclined on the fulcrum of the support 31 and, therefore, the reflecting surface 33 formed on the plate member 32 is inclined.

Light successively reflected by the mirror elements 2a of the first spatial light modulator 2 and by the mirror elements 3a of the second spatial light modulator 3 travels via a fixed stop (flare stop) 4, a condensing optical system 5 as a Fourier transform lens, and a path bending mirror 6 to enter a micro fly's eye lens (or fly's eye lens) 7 as an optical integrator. The micro fly's eye lens 7 is, for example, an optical element consisting of a large number of micro lenses with a positive refracting power arranged vertically and horizontally and densely, and is made by forming the micro lens group in a plane-parallel plate by etching.

In the micro fly's eye lens, different from a fly's eye lens consisting of lens elements isolated from each other, the large number of micro lenses (micro refracting faces) are integrally formed without being isolated from each other. However, the micro fly's eye lens is an optical integrator of the same wavefront division type as the fly's eye lens, in that the lens elements are arranged vertically and horizontally. A beam incident to the micro fly's eye lens 7 is two-dimensionally divided by the large number of micro lenses and a light source is formed on a rear focal plane of each micro lens to which the beam is incident.

Namely, a substantial surface illuminant consisting of a large number of light sources (which will be referred to hereinafter as a "secondary light source") is formed on the rear focal plane of the micro fly's eye lens 7. Beams from the secondary light source formed on the rear focal plane of the micro fly's eye lens 7 pass through a condenser optical system 8 to superposedly illuminate a mask blind 9. It is also possible to dispose an aperture stop behind or in front of the micro fly's eye lens 7, in order to limit the beams.

In this manner, an illumination field of a rectangular shape according to the shape and focal length of each micro lens forming the micro fly's eye lens 7 is formed on the mask blind 9 as an illumination field stop. Beams passing through a rectangular aperture (light transmitting portion) of the mask blind 9 are subjected to focusing action of an imaging optical system 10 and are deflected by a path bending mirror 10c disposed in an optical path between a front unit 10a and a rear unit 10b of the imaging optical system 10, to superposedly illuminate a mask (reticle) M on which a predetermined pattern is formed.

Namely, the imaging optical system 10 forms an image of the rectangular aperture of the mask blind 9 on the mask M. A beam passing through the mask M travels through a projection optical system PL to form an image of the mask pattern on a wafer W as a photosensitive substrate. In this way, the pattern of the mask M is sequentially transferred into each of exposure areas on the wafer W, by performing batch exposure or scan exposure while two-dimensionally driving and controlling the wafer W in a plane perpendicular to the optical axis AX of the projection optical system PL.

In the present embodiment, the spatial light modulators 2, 3 applied herein are those continuously changing each of orientations (reflection directions) of the mirror elements 2a, 3a arranged two-dimensionally, as described above. Such spatial light modulators can be selected, for example, from the spatial light modulators disclosed in Japanese Patent Application Laid-open (Translation of PCT Application) No. 10-503300 and European Patent Application Publication EP 779530 corresponding thereto, Japanese Patent Application Laid-open No. 2004-78136 and U.S. Pat. No. 6,900,915 corresponding thereto, Japanese Patent Application Laid-open (Translation of PCT Application) No. 2006-524349 and U.S. Pat. No. 7,095,546 corresponding thereto, and Japanese Patent Application Laid-open No. 2006-113437. The orientations of the mirror elements 2a, 3a arranged two-dimensionally may be controlled discretely in multiple stages.

In the first spatial light modulator 2, the drive unit 2b to operate according to the posture control signal from the control unit CR changes each of the postures of the mirror elements 2a, whereby the reflecting surface of each mirror element 2a is set in a predetermined orientation. Light reflected at respective predetermined angles by the mirror elements 2a of the first spatial light modulator 2 is then incident to the second spatial light modulator 3. Specifically, beams having traveled via the respective mirror elements 2a of the first spatial light modulator 2 are incident to the corresponding mirror elements 3a of the second spatial light modulator 3 arranged two-dimensionally in one-to-one correspondence.

In the second spatial light modulator 3, similar to the first spatial light modulator 2, the drive unit 3b to operate according to the posture control signal from the control unit CR also changes each of the postures of the mirror elements 3a, whereby each mirror element 3a is set in a predetermined orientation. Light reflected at respective predetermined angles by the mirror elements 3a of the second spatial light modulator 3 forms an illumination field, for example, consisting of a light intensity distribution of an annular shape centered on the optical axis AX, on the entrance plane of the micro fly's eye lens 7, according to the combination of the mirror elements 2a and the mirror elements 3a, the postures of the respective mirror elements 2a, 3a, and so on.

Figure 3:
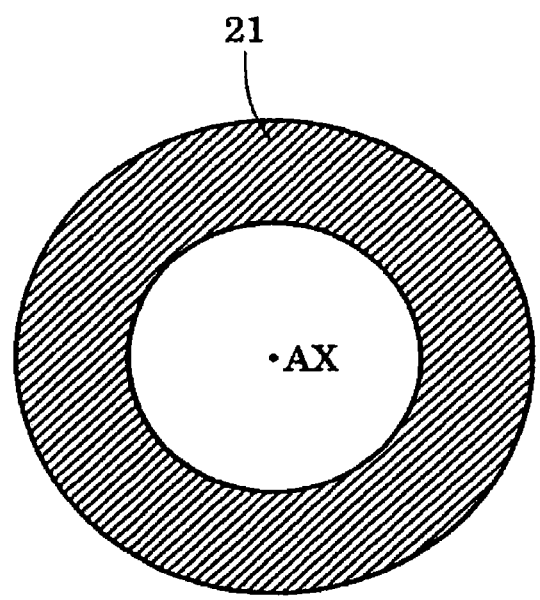
FIG. 3 is a drawing schematically showing an annular pupil intensity distribution formed on a rear focal plane of a micro fly's eye lens.

In this manner, as shown in FIG. 3, the secondary light source with much the same light intensity distribution as the illumination field formed by the incident beam, i.e., pupil intensity distribution 21 of an annular shape centered on the optical axis AX, is formed on the rear focal plane of the micro fly's eye lens 7 (and, therefore, on the illumination pupil). Furthermore, a light intensity distribution of an annular shape corresponding to the pupil intensity distribution 21 is also formed at other illumination pupil positions optically conjugate with the rear focal plane of the micro fly's eye lens 7, i.e., at the pupil position of the imaging optical system 10 and at the pupil position of the projection optical system PL. As described above, the condensing optical system 5 and the micro fly's eye lens 7 constitute a distribution forming optical system that forms a predetermined light intensity distribution on the illumination pupil, based on the beam having traveled via the first spatial light modulator 2 and the second spatial light modulator 3.

In the above description, the annular illumination field is formed on the entrance plane of the micro fly's eye lens 7 by the action of the pair of spatial light modulators 2, 3 and the annular light intensity distribution 21 is formed on the illumination pupil eventually, whereby annular illumination is implemented based on this annular pupil intensity distribution 21. However, without having to be limited to the annular illumination, it is also possible to implement multi-pole illumination (dipole illumination, quadrupole illumination, or other illumination) based on a multi-polar pupil intensity distribution, for example, by forming a light intensity distribution of a multi-polar shape (dipolar shape, quadrupolar shape, or other shape) on the entrance plane of the micro fly's eye lens 7 and forming a light intensity distribution of a multi-polar shape on the illumination pupil eventually.

The illumination optical apparatus (1 to 10) of the present embodiment has the spatial light modulation unit having the pair of spatial light modulators 2, 3, and the distribution forming optical system (5, 7) to form the light intensity distribution 21 on the illumination pupil on the basis of the beam having traveled via this spatial light modulation unit (2, 3). In the spatial light modulation unit (2, 3), the orientations of the mirror elements 2a each are controlled so that beams having traveled via the respective mirror elements 2a of the first spatial light modulator 2 can be incident to the corresponding mirror elements 3a of the second spatial light modulator 3 arranged two-dimensionally in one-to-one correspondence to the mirror elements 2a, and the orientations of the mirror elements 3a of the second spatial light modulator 3 each are also controlled.

In this manner, the illumination optical apparatus (1 to 10) of this embodiment enables the simultaneous control on positions and angles of rays incident to the entrance plane of the micro fly's eye lens 7 by appropriately setting the combination of the mirror elements 2a of the first spatial light modulator 2 and the mirror elements 3a of the second spatial light modulator 3, the postures of the respective mirror elements 2a, 3a, and so on. Namely, it becomes feasible to simultaneously adjust (or correct) the shape and illuminance of the pupil intensity distribution 21 formed on the illumination pupil at the rear focal plane of the micro fly's eye lens 7, through the cooperation with the pair of spatial light modulators 2, 3.

It is important for the exposure apparatus to perform exposure under an appropriate illumination condition according to a pattern characteristic, in order to highly accurately and faithfully transfer the pattern of the mask M onto the wafer W. In this embodiment, the pupil intensity distribution can be freely and quickly changed by the action of the pair of spatial light modulators 2, 3 in which the postures of the mirror elements 2a, 3a each are individually changed, and, therefore, the present embodiment is able to realize illumination conditions of great variety as to the shape and size of the pupil intensity distribution.

As in the above-described embodiment, the illumination optical apparatus (1 to 10) to illuminate the mask M as an illumination target surface on the basis of the light from the light source LS is able to form the pupil intensity distribution 21 of the desired shape and desired illuminance on the illumination pupil at the rear focal plane of the micro fly's eye lens 7 and, in turn, to realize the illumination conditions of great variety. The exposure apparatus (1-PL) of the present embodiment is able to perform good exposure under an appropriate illumination condition realized according to a pattern characteristic of the mask M, using the illumination optical apparatus (1 to 10) capable of realizing the illumination conditions of great variety.

Since the illumination optical apparatus described in the aforementioned Document 1 uses the movable multi-mirror singly as a spatial light modulator, the plane where the mirror elements are arranged makes the angle of about 45° with respect to the optical axis. In this case, when the mirror elements near the optical axis are arranged at a desired position along the optical axis, the mirror elements distant from the optical axis will positionally deviate in the optical-axis direction from the desired position. As a result, the positional deviation in the optical-axis direction of the mirror elements will cause an angle distribution of beams arriving at a point on the entrance plane of the fly's eye lens, to become rotationally asymmetric and thus it becomes difficult to keep the illuminance distribution constant on the wafer W.

In the present embodiment, the pair of spatial light modulators 2, 3 are arranged so that the plane of the first spatial light modulator 2 where the mirror elements 2a are arranged and is opposed to the plane of the second spatial light modulator 3 where the mirror elements 3a are arranged, e.g., so that these two planes become approximately parallel. Therefore, the influence of the positional deviation in the optical-axis direction of the mirror elements 2a, 3a distant from the optical axis AX is canceled out by the first spatial light modulator 2 and the second spatial light modulator 3, which facilitates achievement of keeping the illuminance distribution constant on the wafer W.

In the above embodiment there is no optical member arranged in the optical path between the first spatial light modulator 2 and the second spatial light modulator 3, but, without having to be limited to this, it is also possible to place a relay optical system or the like in this optical path. It is, however, desirable to place no optical member in the optical path or to place no optical member having a power in the optical path, in order to facilitate the setting of the one-to-one correspondence relation between the mirror elements 2a of the first spatial light modulator 2 and the mirror elements 3a of the second spatial light modulator 3. Furthermore, in order to facilitate the setting of the one-to-one correspondence relation between the mirror elements 2a, 3a, it is desirable to make a nearly parallel beam incident to the first spatial light modulator 2, i.e., to select a combination of the illumination optical apparatus with a light source which supplies a nearly parallel beam to the first spatial light modulator 2.

In the above embodiment, the predetermined light intensity distribution is formed on the entrance plane of the micro fly's eye lens 7 being an optical integrator of the wavefront division type and, in turn, the predetermined pupil intensity distribution is realized. However, without having to be limited to this, it is also feasible to realize the predetermined pupil intensity distribution, by forming a virtual image of the predetermined light intensity distribution on an entrance plane of an optical integrator of an internal reflection type.

The above embodiment shows the configuration wherein the beams having traveled via the mirror elements 2a of the first spatial light modulator 2 are incident to the corresponding mirror elements 3a of the second spatial light modulator 3 arranged two-dimensionally in the one-to-one correspondence to the mirror elements 2a, but it is also possible to adopt a configuration wherein a beam having traveled via one of the minor elements 2a of the first spatial light modulator 2 is incident to two or more mirror elements 3a of the second spatial light modulator 3. In other words, the mirror elements 2a of the first spatial light modulator 2 and the mirror elements 3a of the second spatial light modulator 3 may be in a one-to-two or more relation. In this case, the beams having traveled via the mirror elements 2a of the first spatial light modulator 2 are diverging beams.

Conversely, it is also possible to adopt a configuration wherein the minor elements 2a of the first spatial light modulator 2 and the minor elements 3a of the second spatial light modulator 3 are in a two or more-to-one relation. Furthermore, the minor elements 2a of the first spatial light modulator 2 and the minor elements 3a of the second spatial light modulator 3 may be in a two or more-to-two or more relation (e.g., like a case where two minor elements 2a of the first spatial light modulator 2 correspond to three minor elements 3a of the second spatial light modulator 3).

In the above embodiment, the pair of spatial light modulators 2, 3 are arranged so that the plane where the mirror elements 2a of the first spatial light modulator 2 are arranged is approximately parallel to the plane where the mirror elements 3a of the second spatial light modulator 3 are arranged. However, without having to be limited to this, various forms can be contemplated as to the arrangement of the pair of spatial light modulators 2, 3.

Figure 4:
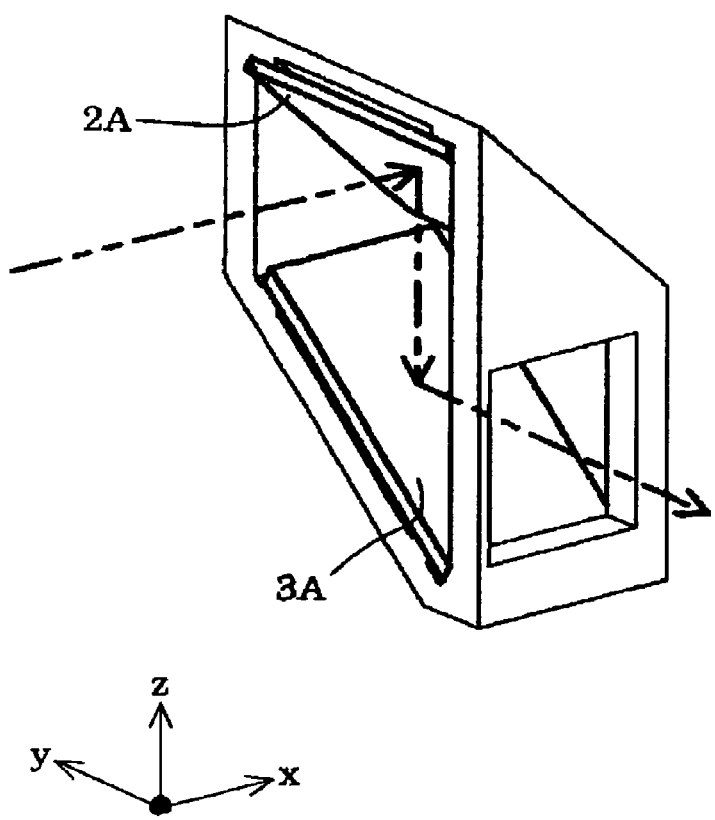
FIG. 4 is a drawing schematically showing another arrangement example of a pair of spatial light modulators.
Figure 5:
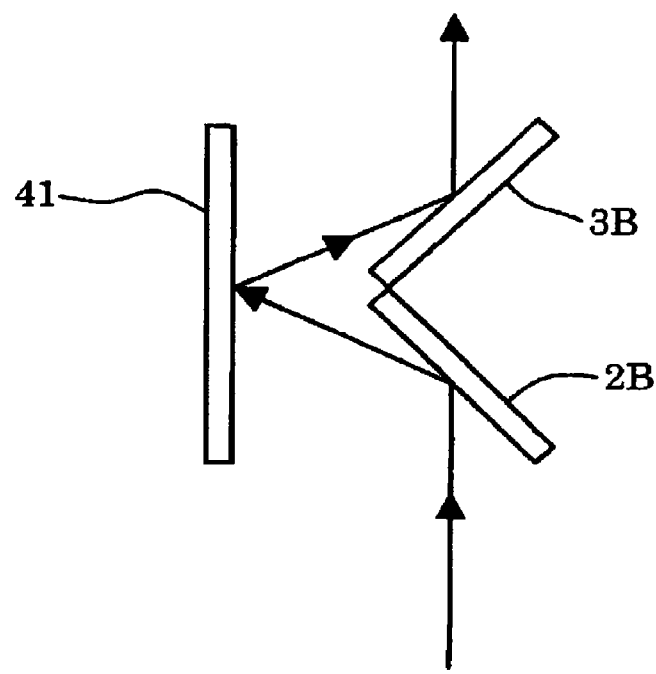
FIG. 5 is a drawing schematically showing still another arrangement example of a pair of spatial light modulators.

For example, as shown in FIG. 4, a pair of spatial light modulators 2A, 3A may be three-dimensionally arranged so that the first spatial light modulator 2A reflects (or deflects) light incident in the x-direction, into the −z direction and so that the second spatial light modulator 3A reflects light incident in the −z direction, into the −y direction. Furthermore, as shown in FIG. 5, it is also possible to adopt a configuration wherein a plane reflector 41 is additionally provided in the optical path between the first spatial light modulator 2B and the second spatial light modulator 3B. Namely, the pair of spatial light modulators 2B, 3B may be arranged in a V-shape so that light incident to the plane reflector 41 via the first spatial light modulator 2B is guided to the second spatial light modulator 3B.

Figure 6:
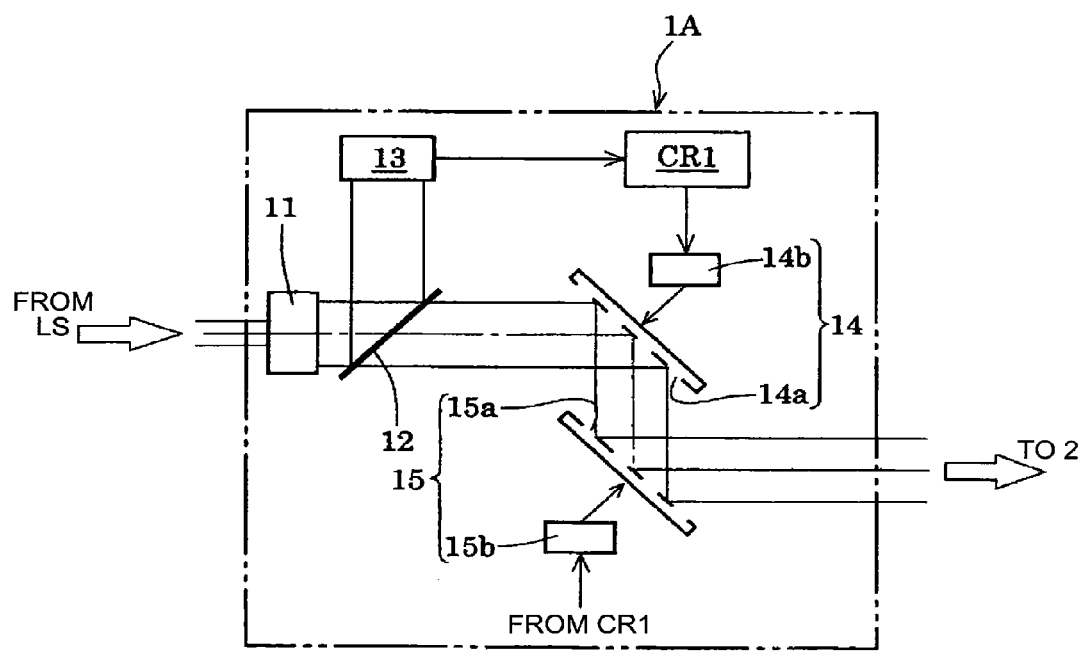
FIG. 6 is a drawing schematically showing an internal configuration of a sending optical system in which a second spatial light modulation unit is incorporated.

In the above embodiment, a second spatial light modulation unit may be incorporated in the sending optical system 1 to guide the beam from the light source LS to the spatial light modulation unit (2, 3). The sending optical system 1A according to a modification example shown in FIG. 6 is provided with a shaping optical system 11 to convert the beam supplied from the light source LS, into a beam having a cross section of an appropriate size and shape. The beam through the shaping optical system 11 is then incident to a beam splitter 12.

A beam reflected by the beam splitter 12 to the outside of the illumination optical path is incident to a detector 13. An output signal from the detector 13 is supplied to a control unit CR1. A beam transmitted by the beam splitter 12 and guided along the illumination optical path is successively incident to the first spatial light modulator 14 and the second spatial light modulator 15 in the second spatial light modulation unit. The beam having traveled via the second spatial light modulation unit (14, 15) is emitted from the sending optical system 1A to be guided to the first spatial light modulator 2 in the first spatial light modulation unit (2, 3).

The second spatial light modulation unit (14, 15) has much the same configuration as the first spatial light modulation unit (2, 3). Namely, the first spatial light modulator 14 has a plurality of mirror elements 14a arranged two-dimensionally, and a drive unit 14b to individually change the postures of the mirror elements 14a in accordance with a posture control signal from the control unit CR1. The second spatial light modulator 15 has a plurality of mirror elements 15a arranged two-dimensionally, and a drive unit 15b to individually change the postures of the mirror elements 15a in accordance with a posture control signal from the control unit CR1. The mirror elements 15a of the second spatial light modulator 15 are two-dimensionally arranged in one-to-one correspondence to the mirror elements 14a of the first spatial light modulator 14, and the postures thereof are individually controlled.

In the first spatial light modulator 14, the drive unit 14b to operate according to the posture control signal from the control unit CR1 adjusts each of the postures of the mirror elements 14a, whereby each mirror element 14a is set in a predetermined orientation. Light reflected at respective predetermined angles by the mirror elements 14a of the first spatial light modulator 14 is incident to the second spatial light modulator 15. Specifically, beams having traveled via the respective mirror elements 14a of the first spatial light modulator 14 are incident to the corresponding mirror elements 15a of the second spatial light modulator 15 which are two-dimensionally arranged in the one-to-one correspondence to the mirror elements 14a.

In the second spatial light modulator 15, similar to the first spatial light modulator 14, the drive unit 15b to operate according to the posture control signal from the control unit CR1 also adjusts each of the postures of the mirror elements 15a, whereby each mirror element 15a is set in a predetermined orientation. Light reflected at respective predetermined angles by the mirror elements 15a of the second spatial light modulator 15 is converted into beams with a predetermined light intensity distribution according to the combination of the mirror elements 14a and the mirror elements 15a and the like and the beams are emitted from the sending optical system 1A.

In the sending optical system 1A according to the modification example shown in FIG. 6, the beam splitter 12 and detector 13 constitute a distribution measuring unit to measure the light intensity distribution of the beam incident from the light source LS to the second spatial light modulation unit (14, 15). Furthermore, the control unit CR1 constitutes a control unit to control the second spatial light modulation unit (14, 15) on the basis of the result of the measurement by the distribution measuring unit (12, 13).

In the sending optical system 1A, as described above, the distribution measuring unit (12, 13) measures the light intensity distribution of the beam incident to the second spatial light modulation unit (14, 15) and the control unit CR1 individually controls the postures of the respective mirror elements 14a, 15a in the second spatial light modulation unit (14, 15) on the basis of the measurement result by the distribution measuring unit (12, 13). This configuration makes it feasible to appropriately convert the incident beam into the beam with the desired light intensity distribution and emit the converted beam.

In general, a beam supplied from an ArF excimer laser light source or a KrF excimer laser light source has a light intensity distribution of a form wherein the light intensity is higher in the center than in the periphery. For this reason, an optical material of each optical member arranged in the illumination optical path is more likely to deteriorate, particularly, in its central region where the energy density of the incident beam is high. In addition, a phenomenon of "clouding" on an optical surface is likely to occur because of adhesion of a material to the optical surface, damage of the optical surface due to photochemical reaction, and so on.

The sending optical system 1A is able to convert the incident light into a beam with a desired light intensity distribution, e.g., a nearly even light intensity distribution, and to guide the converted beam to the first spatial light modulation unit (2, 3). Therefore, it is feasible to well suppress the damage, deterioration of optical properties, etc. of the optical members arranged behind the sending optical system 1A, particularly, each mirror element 2a, 3a in the first spatial light modulation unit (2, 3) arranged immediately after the sending optical system 1A.

In the second spatial light modulation unit (14, 15) in the sending optical system 1A, there is no optical member arranged in the optical path between the first spatial light modulator 14 and the second spatial light modulator 15, but, without having to be limited to this, a relay optical system or the like may be arranged in this optical path. However, just as in the case of the first spatial light modulation unit (2, 3), it is desirable to place no optical member in the optical path or to place no optical member having a power in the optical path, in order to facilitate the setting of the one-to-one correspondence relation between the mirror elements 14a of the first spatial light modulator 14 and the mirror elements 15a of the second spatial light modulator 15. It is also desirable to make a nearly parallel beam incident to the first spatial light modulator 14, in order to facilitate the setting of the one-to-one correspondence relation between the mirror elements 14a and 15a.

In the second spatial light modulation unit (14, 15) in the sending optical system 1A, the pair of spatial light modulators 14, 15 are arranged so that the plane of the first spatial light modulator 14 where the mirror elements 14a are arranged is approximately parallel to the plane of the second spatial light modulator 15 where the mirror elements 15a are arranged. However, various forms can also be contemplated as to the arrangement of the pair of spatial light modulators 14, 15, as in the case of the first spatial light modulation unit (2, 3).

In the above embodiment, the spatial light modulators in which the orientations (angles: inclinations) of the reflecting surfaces arranged two-dimensionally can be individually controlled are applied as the spatial light modulators with the plurality of optical elements arranged two-dimensionally and posture-controlled individually. However, without having to be limited to this, it is also possible, for example, to apply spatial light modulators in which heights (positions) of the reflecting surfaces arranged two-dimensionally can be individually controlled. Such spatial light modulators applicable herein can be selected, for example, from those disclosed in Japanese Patent Application Laid-open No. 6-281869 and U.S. Pat. No. 5,312,513 corresponding thereto, and in FIG. 1d of Japanese Patent Application Laid-open (Translation of PCT Application) No. 2004-520618 and U.S. Pat. No. 6,885,493 corresponding thereto. These spatial light modulators are able to apply the same action as a diffracting surface, to incident light by forming a two-dimensional height distribution therein. The aforementioned spatial light modulators with the plurality of reflecting surfaces arranged two-dimensionally may be modified, for example, according to the disclosure in Japanese Patent Application Laid-open (Translation of PCT Application) No. 2006-513442 and U.S. Pat. No. 6,891,655 corresponding thereto, or according to the disclosure in Japanese Patent Application Laid-open (Translation of PCT Application) No. 2005-524112 and U.S. Pat. Published Application No. 2005/0095749 corresponding thereto. The teachings in U.S. Pat. No. 5,312,513, U.S. Pat. No. 6,885,493, U.S. Pat. No. 6,891,655, and U.S. Pat. Published Application No. 2005/0095749 are incorporated herein by reference.

In the above embodiment, each spatial light modulator applied is the reflective spatial light modulator with the plurality of mirror elements, but, without having to be limited to this, it is also possible, for example, to apply the transmissive spatial light modulator disclosed in U.S. Pat. No. 5,229,872. The teachings in U.S. Pat. No. 5,229,872 are incorporated herein by reference.

In the above-described embodiment, the optical system may be modified so that in the formation of the pupil intensity distribution using the spatial light modulators, the pupil intensity distribution is measured with a pupil intensity distribution measuring device and the spatial light modulators are controlled according to the result of the measurement. Such technology is disclosed, for example, in Japanese Patent Application Laid-open No. 2006-54328 and in Japanese Patent Application Laid-open No. 2003-22967 and U.S. Pat. Published Application No. 2003/0038225 corresponding thereto. The teachings in U.S. Pat. Published Application No. 2003/0038225 are incorporated herein by reference.

In the aforementioned embodiment, the mask can be replaced with a variable pattern forming device which forms a predetermined pattern on the basis of predetermined electronic data. Use of such a variable pattern forming device can minimize influence on synchronization accuracy even when the pattern surface is set vertical. The variable pattern forming device applicable herein can be, for example, a DMD (Digital Micromirror Device) including a plurality of reflective elements driven based on predetermined electronic data. The exposure apparatus with the DMD is disclosed, for example, in Japanese Patent Application Laid-open No. 2004-304135 and International Publication WO2006/080285 and U.S Pat. Published Application No. 2007/0296936 corresponding thereto. Besides the reflective spatial light modulators of the non-emission type like the DMD, it is also possible to apply transmissive spatial light modulators or self-emission type image display devices. It is noted that the variable pattern forming device can also be applied in cases where the pattern surface is set horizontal. The teachings in U.S. Pat. Published Application No. 2007/0296936 are incorporated herein by reference.

The exposure apparatus of the foregoing embodiment is manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling blocks from the various sub-systems into the exposure apparatus include mechanical connections, wire connections of electric circuits, pipe connections of pneumatic circuits, etc. between the various sub-systems. It is needless to mention that there are assembling blocks of the individual sub-systems, before the assembling blocks from the various sub-systems into the exposure apparatus. After completion of the assembling blocks from the various sub-systems into the exposure apparatus, overall adjustment is carried out to ensure various accuracies as the entire exposure apparatus. The manufacture of exposure apparatus is desirably performed in a clean room in which the temperature, cleanliness, etc. are controlled.

Figure 7:
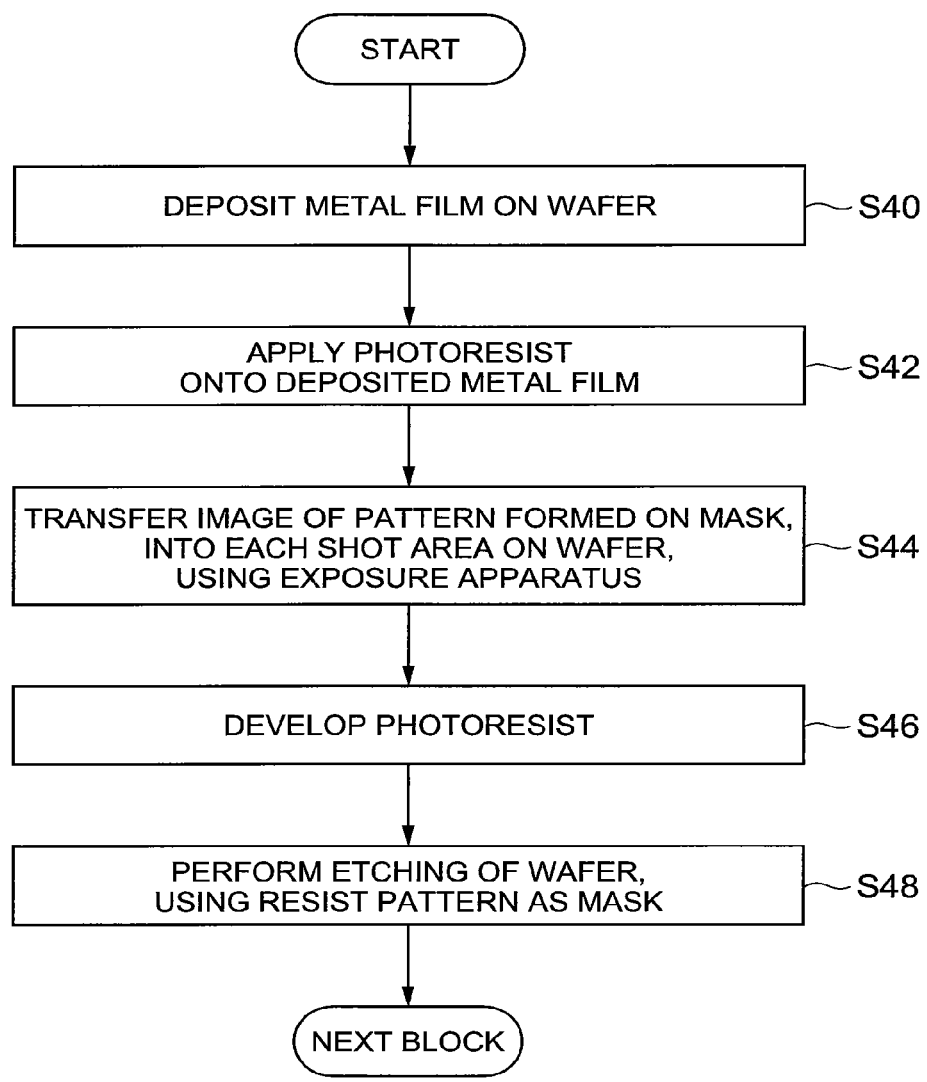
FIG. 7 is a flowchart for explaining manufacturing blocks of semiconductor devices, as a device manufacturing method according to an embodiment of the present invention.

The following will describe a device manufacturing method using the exposure apparatus (projection exposure apparatus) according to the above-described embodiment. FIG. 7 is a flowchart for explaining manufacturing blocks of semiconductor devices, as a device manufacturing method according to an embodiment of the present invention. As shown in FIG. 7, the manufacturing blocks of semiconductor devices include depositing a metal film on a wafer W to become a substrate of semiconductor devices (block S40) and applying a photoresist as a photosensitive material onto the deposited metal film (block S42). The subsequent blocks include transferring a pattern formed on a mask (reticle) M, into each shot area on the wafer W, using the aforementioned projection exposure apparatus (block S44: exposure block), and developing the wafer W after completion of the transfer, i.e., developing the photoresist to which the pattern has been transferred (block S46: development block). Thereafter, using the resist pattern made on the surface of the wafer W in block S46, as a mask, processing such as etching is carried out on the surface of the wafer W (block S48: processing block).

The resist pattern herein is a photoresist layer in which depressions and projections are formed in a shape corresponding to the pattern transferred by the projection exposure apparatus and which the depressions penetrate throughout. Step S48 is to process the surface of the wafer W through this resist pattern. The processing carried out in block S48 includes, for example, at least either etching of the surface of the wafer W or deposition of a metal film or the like. In block S44, the projection exposure apparatus performs the transfer of the pattern onto the wafer W coated with the photoresist, as a photosensitive substrate or plate P.

Figure 8:
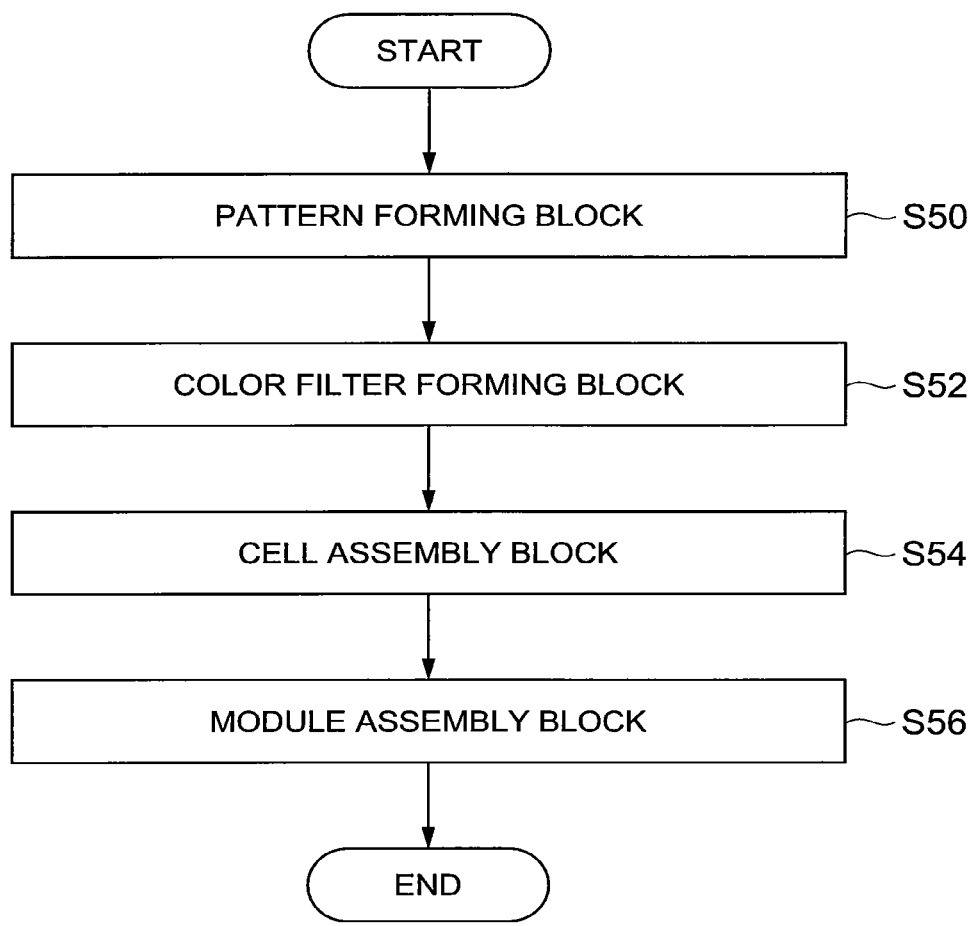
FIG. 8 is a flowchart for explaining manufacturing blocks of a liquid crystal device such as a liquid crystal display device, as a device manufacturing method according to another embodiment of the present invention.

FIG. 8 is a flowchart for explaining manufacturing blocks of a liquid crystal device such as a liquid-crystal display device, as a device manufacturing method according to another embodiment of the present invention. As shown in FIG. 8, the manufacturing blocks of the liquid crystal device include sequentially performing a pattern forming block (block S50), a color filter forming block (block S52), a cell assembly block (block S54), and a module assembly block (block S56).

The pattern forming block of block S50 is to form predetermined patterns such as a circuit pattern and an electrode pattern on a glass substrate coated with a photoresist, as a plate P, using the aforementioned projection exposure apparatus. This pattern forming block includes an exposure block of transferring a pattern to a photoresist layer, using the projection exposure apparatus, a development block of performing development of the plate P to which the pattern has been transferred, i.e., development of the photoresist layer on the glass substrate, and making the photoresist layer in the shape corresponding to the pattern, and a processing block of processing the surface of the glass substrate through the developed photoresist layer.

The color filter forming block of block S52 is to form a color filter in which a large number of sets of three dots corresponding to R (Red), G (Green), and B (Blue) are arrayed in a matrix pattern, or in which a plurality of filter sets of three stripes of R, G, and B are arrayed in a horizontal scan direction.

The cell assembly block of block S54 is to assemble a liquid crystal panel (liquid crystal cell), using the glass substrate on which the predetermined pattern has been formed in block S50, and the color filter formed in block S52. Specifically, a liquid crystal is poured into between the glass substrate and the color filter to form the liquid crystal panel. The module assembly block of block S56 is to attach various components such as electric circuits and backlights for display operation of this liquid crystal panel, to the liquid crystal panel assembled in block S54.

The present invention is not limited just to the application to the exposure apparatus for manufacture of semiconductor devices, but can also be widely applied, for example, to the exposure apparatus for the liquid-crystal display devices formed with rectangular glass plates, or for display devices such as plasma displays, and the exposure apparatus for manufacture of various devices such as imaging devices (CCDs and others), micromachines, thin-film magnetic heads, and DNA chips. Furthermore, an embodiment of the present invention is also applicable to the exposure block (exposure apparatus) for manufacture of masks (photomasks, reticles, etc.) on which mask patterns of various devices are formed, by the photolithography process.

The above-described embodiment used the ArF excimer laser light (wavelength: 193 nm) or the KrF excimer laser light (wavelength: 248 nm) as the exposure light, but, without having to be limited to this, an embodiment of the present invention can also be applied to any other appropriate laser light source, e.g., an $F_2$ laser light source which supplies laser light at the wavelength of 157 nm.

In the foregoing embodiments, it is also possible to apply a technique of filling the interior of the optical path between the projection optical system and the photosensitive substrate with a medium having the refractive index larger than 1.1 (typically, a liquid), which is so called a liquid immersion method. In this case, it is possible to adopt one of the following techniques as a technique of filing the interior of the optical path between the projection optical system and the photosensitive substrate with the liquid: the technique of locally filling the optical path with the liquid as disclosed in International Publication WO99/49504; the technique of moving a stage holding the substrate to be exposed, in a liquid bath as disclosed in Japanese Patent Application Laid-open No. 6-124873; the technique of forming a liquid bath of a predetermined depth on a stage and holding the substrate therein as disclosed in Japanese Patent Application Laid-open No. 10-303114, and so on. Teachings in International Publication WO99/49504, Japanese Patent Application Laid-open No. 6-124873, and Japanese Patent Application Laid-open No. 10-303114 are incorporated as references herein.

In the foregoing embodiment, it is also possible to apply the so-called polarized illumination method disclosed in U.S Pat. Published Application Nos. 2006/0203214, 2006/0170901, and 2007/0146676. Teachings of the U.S Pat. Published Application Nos. 2006/0203214, 2006/0170901, and 2007/0146676 are incorporated herein by reference.

The aforementioned embodiment was the application of the present invention to the illumination optical apparatus illuminating the mask in the exposure apparatus, but, without having to be limited to this, an embodiment of the present invention can also be applied to a generally-used illumination optical apparatus which illuminates an illumination target surface except for the mask.

In the illumination optical apparatus according to an embodiment of the present invention, the light having traveled sequentially via the pair of spatial light modulators travels via the condensing optical system functioning, for example, as a Fourier transform lens to enter the optical integrator. As a result, the cooperation of the pair of spatial light modulators enables the simultaneous control of positions and angles of rays incident to the entrance plane of the optical integrator and, in turn, enables simultaneous adjustment (or correction) for the shape and illuminance of the pupil intensity distribution.

In this manner, the illumination optical apparatus according to an embodiment of the present invention is able to form the pupil intensity distribution of the desired shape and desired illuminance and, in turn, to realize the illumination conditions of great variety. The exposure apparatus according to an embodiment of the present invention is able to perform good exposure under an appropriate illumination condition realized according to a pattern characteristic of a mask, using the foregoing illumination optical apparatus capable of realizing the illumination conditions of great variety, and, in turn, to manufacture good devices.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An optical system which is used in an exposure apparatus which illuminates a pattern with illumination light from a light source and exposes a photosensitive substrate with light from the pattern, the optical system comprising:
    a first spatial light modulator which is arranged on an optical path of the illumination light, has a plurality of first optical elements which are arranged two-dimensionally and postures of which are individually controlled, and modulates light incident thereon to light with a predetermined angle distribution;
    a second spatial light modulator which is arranged on the optical path of the illumination light, has a plurality of second optical elements which are arranged two-dimensionally and postures of which are individually controlled, and modulates light incident thereon to light with a predetermined angle distribution;
    a distribution forming optical system which makes the illumination light modulated by the first and second spatial light modulators be distributed on a pupil plane, the distribution forming optical system being configured to have a Fourier transform optical system and a two-dimensional light divider which two-dimensionally divides light incident thereon from the Fourier transform optical system; and
    a control unit which controls the first and second spatial light modulators so that a position of the light incident on the two-dimensional light divider and the angle of the light incident along the two-dimensional light divider are individually set at predetermined values, and
    wherein the pattern is illuminated with illumination light from the pupil plane.

2. The optical system according to claim 1,
    wherein no optical member is arranged between the first spatial light modulator and the second spatial light modulator.

3. The optical system according to claim 1,
    wherein the distribution forming optical system includes an optical surface array which applies an angle distribution to the illumination light modulated by the first and second spatial light modulators.

4. The optical system according to claim 3,
    wherein a plurality of optical surfaces in the optical surface array are arranged on the pupil plane.

5. The optical system according to claim 3, further comprising a condensing optical system which guides the illumination light from the pupil plane to the pattern.

6. The optical system according to claim 5,
    wherein the optical surface array includes a fly's eye lens.

7. The optical system according to claim 1, further comprising a projection optical system which forms an image of the pattern onto the photosensitive substrate,
    wherein the pupil plane is optically conjugate with a pupil plane of the projection optical system.

8. An exposure apparatus configured to illuminate a pattern with illumination light from a light source and expose a photosensitive substrate with light from the pattern, comprising the optical system as set forth in claim 1.

9. An optical system which is used in an exposure apparatus which illuminates a pattern with illumination light from a light source and exposes a photosensitive substrate with light from the pattern, the optical system comprising:
    an active spatial light modulator which is arranged on an optical path of the illumination light, has a plurality of optical elements which are arranged two-dimensionally and postures of which are individually controlled, and modulates light incident thereon to light with a predetermined angle distribution;
    a spatial light modulator which applies an angle distribution to the illumination light modulated by the active spatial light modulator; and
    a distribution forming optical system which makes the illumination light from the spatial light modulator be distributed on a pupil plane, the distribution forming optical system being configured to have a Fourier transform optical system and a two-dimensional light divider which two-dimensionally divides light from the Fourier transform optical system,
    wherein the pattern is illuminated with the illumination light from the pupil plane.

10. A device manufacturing method comprising:
    illuminating a pattern with illumination light from a light source and exposing a photosensitive substrate with light from the pattern,
    forming a mask layer in a shape corresponding to the pattern on a surface of the photosensitive substrate after developing the photosensitive substrate onto which the pattern has been transferred; and
    processing a surface of the photosensitive substrate through the mask layer,
    wherein the exposing includes:
    modulating light incident on a first spatial light modulator with a predetermined angle distribution, the first spatial light modulator being configured to have a plurality of first optical elements which are arranged two-dimensionally and postures of which are individually controlled;
    modulating light incident on a second spatial light modulator with a predetermined angle distribution, the second spatial light modulator being configured to have a plurality of second optical elements which are arranged two-dimensionally and postures of which are individually controlled;
    illuminating the illumination light modulated by the first and second spatial light modulators onto an optical element array which has a plurality of third optical elements arranged two-dimensionally;
    applying an angle distribution to the illumination light modulated by the first and second spatial light modulators;

making the illumination light modulated by the first and second spatial light modulators be distributed on a pupil plane, by using a Fourier transform optical system and the optical element array;
controlling the first and second spatial light modulators so that a position of the light incident on the optical element array and the angle of the light incident on the optical element array are individually set at predetermined values; and
illuminating the pattern with the illumination light from the pupil plane.

11. A device manufacturing method comprising:
illuminating a pattern with illumination light from a light source and exposing a photosensitive substrate with light from the pattern;
forming a mask layer in a shape corresponding to the pattern on a surface of the photosensitive substrate after developing the photosensitive substrate onto which the pattern has been transferred; and
processing a surface of the photosensitive substrate through the mask layer,
wherein the exposing includes:
modulating light incident on an active spatial light modulator with a predetermined angle distribution, the active spatial light modulator being configured to have a plurality of optical elements which are arranged two-dimensionally and postures of which are individually controlled;
applying an angle distribution to the illumination light modulated by the active spatial light modulator; and
making the illumination light modulated by the active spatial light modulator be distributed on a pupil plane, by using a Fourier transform optical system and a two-dimensional light divider which two-dimensionally divides light from the Fourier transform optical system; and
illuminating the pattern with the illumination light from the pupil plane.

* * * * *